(12) United States Patent
Song et al.

(10) Patent No.: US 10,559,687 B2
(45) Date of Patent: Feb. 11, 2020

(54) SEMICONDUCTOR DEVICE

(71) Applicant: SAMSUNG ELECTRONICS CO., LTD., Suwon-si, Gyeonggi-do (KR)

(72) Inventors: Jae Yeol Song, Seoul (KR); Su Young Bae, Daegu (KR); Dong Soo Lee, Gunpo-si (KR); Hyung Suk Jung, Suwon-si (KR); Sang Jin Hyun, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/974,775

(22) Filed: May 9, 2018

(65) Prior Publication Data

US 2019/0097048 A1  Mar. 28, 2019

(30) Foreign Application Priority Data

Sep. 22, 2017 (KR) .................... 10-2017-0122336

(51) Int. Cl.
*H01L 29/78* (2006.01)
*H01L 29/66* (2006.01)
(Continued)

(52) U.S. Cl.
CPC .. *H01L 29/7831* (2013.01); *H01L 21/823462* (2013.01); *H01L 29/42364* (2013.01); *H01L 29/517* (2013.01); *H01L 29/66545* (2013.01)

(58) Field of Classification Search
CPC ............ H01L 29/66545; H01L 29/517; H01L 21/823462; H01L 29/785; H01L 29/7831;
(Continued)

(56) References Cited

U.S. PATENT DOCUMENTS 7,005,716 B2  2/2006  Lin et al.
8,304,841 B2  11/2012  Xu et al.
(Continued)

FOREIGN PATENT DOCUMENTS

JP  2012-169444 A  9/2012
JP  2015-060867 A  3/2015
(Continued)

*Primary Examiner* — Jasmine J Clark
(74) *Attorney, Agent, or Firm* — Lee & Morse, P.C.

(57) ABSTRACT

A semiconductor device including a substrate; a first and second active region on the substrate; a first recess intersecting with the first active region; a second recess intersecting with the second active region; a gate spacer extending along sidewalls of the first and second recess; a first lower high-k dielectric film in the first recess and including a first high-k dielectric material in a first concentration and a second high-k dielectric material; a second lower high-k dielectric film in the second recess and including the first high-k dielectric material in a second concentration that is greater than the first concentration, and the second high-k dielectric material; a first metal-containing film on the first lower high-k dielectric film and including silicon in a third concentration; and a second metal-containing film on the second lower high-k dielectric film and including silicon in a fourth concentration that is smaller than the third concentration.

20 Claims, 18 Drawing Sheets

(51) Int. Cl.
*H01L 29/423* (2006.01)
*H01L 21/8234* (2006.01)
*H01L 29/51* (2006.01)

(58) Field of Classification Search
CPC ............ H01L 27/088; H01L 21/28194; H01L 29/78696; H01L 29/41725; H01L 21/82345; H01L 29/4175; H01L 29/513; H01L 29/4966
See application file for complete search history.

(56) References Cited

U.S. PATENT DOCUMENTS

| | | |
|---|---|---|
| 9,048,335 B2 | 6/2015 | Chen et al. |
| 2007/0007571 A1* | 1/2007 | Lindsay ............ H01L 21/26586 257/306 |
| 2014/0131806 A1* | 5/2014 | Zhu ................. H01L 21/823456 257/368 |

FOREIGN PATENT DOCUMENTS

| | | |
|---|---|---|
| KR | 10-2010-0122651 A | 11/2010 |
| KR | 10-2016-0095399 A | 8/2016 |

* cited by examiner

SEMICONDUCTOR DEVICE

Korean Patent Application No. 10-2017-0122336 filed on Sep. 22, 2017 in the Korean Intellectual Property Office, and entitled: "Semiconductor Device," is incorporated by reference herein in its entirety.

BACKGROUND

1. Field

Embodiments relate to a semiconductor device.

2. Description of the Related Art

As one of the scaling technologies for increasing the density of a semiconductor device, the multigate transistor has been suggested, wherein a multi-channel active pattern (or silicon body) in the form of a fin or nanowire is formed on a substrate, and then gates are formed on a surface of the multi-channel active pattern.

SUMMARY

The embodiments may be realized by providing a semiconductor device including a substrate; a first active region and a second active region, which are arranged on the substrate; a first recess on the first active region and intersecting with the first active region; a second recess on the second active region and intersecting with the second active region; a gate spacer extending along sidewalls of the first recess and sidewalls of the second recess; a first lower high-k dielectric film in the first recess, the first lower high-k dielectric film including a first high-k dielectric material in a first concentration and a second high-k dielectric material that is different from the first high-k dielectric material; a second lower high-k dielectric film in the second recess, the second lower high-k dielectric film including the first high-k dielectric material in a second concentration that is greater than the first concentration, and the second high-k dielectric material; a first metal-containing film on the first lower high-k dielectric film in the first recess, the first metal-containing film including silicon (Si) in a third concentration; and a second metal-containing film on the second lower high-k dielectric film in the second recess, the second metal-containing film including silicon (Si) in a fourth concentration that is smaller than the third concentration.

The embodiments may be realized by providing a semiconductor device including a substrate; a first active region and a second active region, the first active region and the second active region each extending along a first direction on the substrate; a first gate structure on the first active region and extending along a second direction that intersects with the first direction, the first gate structure having a sequentially stacked structure of a first lower high-k dielectric film that includes a first high-k dielectric material in a first concentration and a second high-k dielectric material different from the first high-k dielectric material, a first upper high-k dielectric film that includes the first high-k dielectric material, and a first metal-containing film that includes silicon (Si) in a third concentration; and a second gate structure on the second active region and extending along the second direction, the second gate structure having a sequentially stacked structure of a second lower high-k dielectric film that includes the first high-k dielectric material in a second concentration, which is greater than the first concentration, and the second high-k dielectric material, a second upper high-k dielectric film that includes the first high-k dielectric material, and a second metal-containing film that includes silicon (Si) in a fourth concentration that is smaller than the third concentration.

The embodiments may be realized by providing a semiconductor device including a substrate; a first active region, a second active region, and a third active region on the substrate; a first gate structure that intersects with the first active region, the first gate structure including a first lower high-k dielectric film that includes a first high-k dielectric material in a first concentration, and a second high-k dielectric material that is different from the first high-k dielectric material, and a first metal-containing film on the first lower high-k dielectric film, the first metal-containing film including silicon (Si) in a third concentration; a second gate structure that intersects with the second active region, the second gate structure including a second lower high-k dielectric film that includes the first high-k dielectric material in a second concentration that is greater than the first concentration, and the second high-k dielectric material, and a second metal-containing film on the second lower high-k dielectric film, the second metal-containing film including silicon (Si) in a fourth concentration that is smaller than the third concentration; and a third gate structure that intersects with the third active region.

BRIEF DESCRIPTION OF THE DRAWINGS

Features will be apparent to those of skill in the art by describing in detail exemplary embodiments with reference to the attached drawings in which.

DETAILED DESCRIPTION

Although drawings for a semiconductor device according to some exemplary embodiments exemplify a fin-type transistor (FinFET) including a channel region in a fin-type pattern shape, the present disclosure is not limited hereto.

That is, it is of course possible that the semiconductor device according to some exemplary embodiments may also include a tunneling transistor (tunneling FET), a transistor including nanowire, a transistor including nano-sheet, or a three-dimensional (3D) transistor. Further, the semiconductor device according to some exemplary embodiments may include a bipolar junction transistor, a laterally diffused metal oxide semiconductor (LDMOS) transistor, or the like.

Hereinbelow, a semiconductor device according to some exemplary embodiments will be described with reference to FIG. 1 to FIG. 4.

Figure 1:
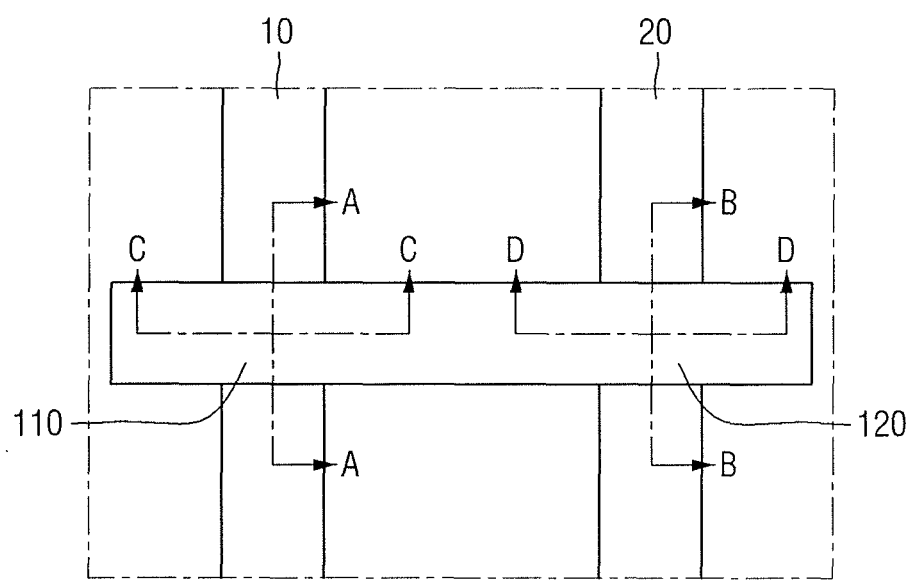
FIG. 1 illustrates a top view of a semiconductor device according to some exemplary embodiments of the present disclosure.
Figure 1:
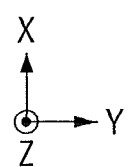
Figure 2:
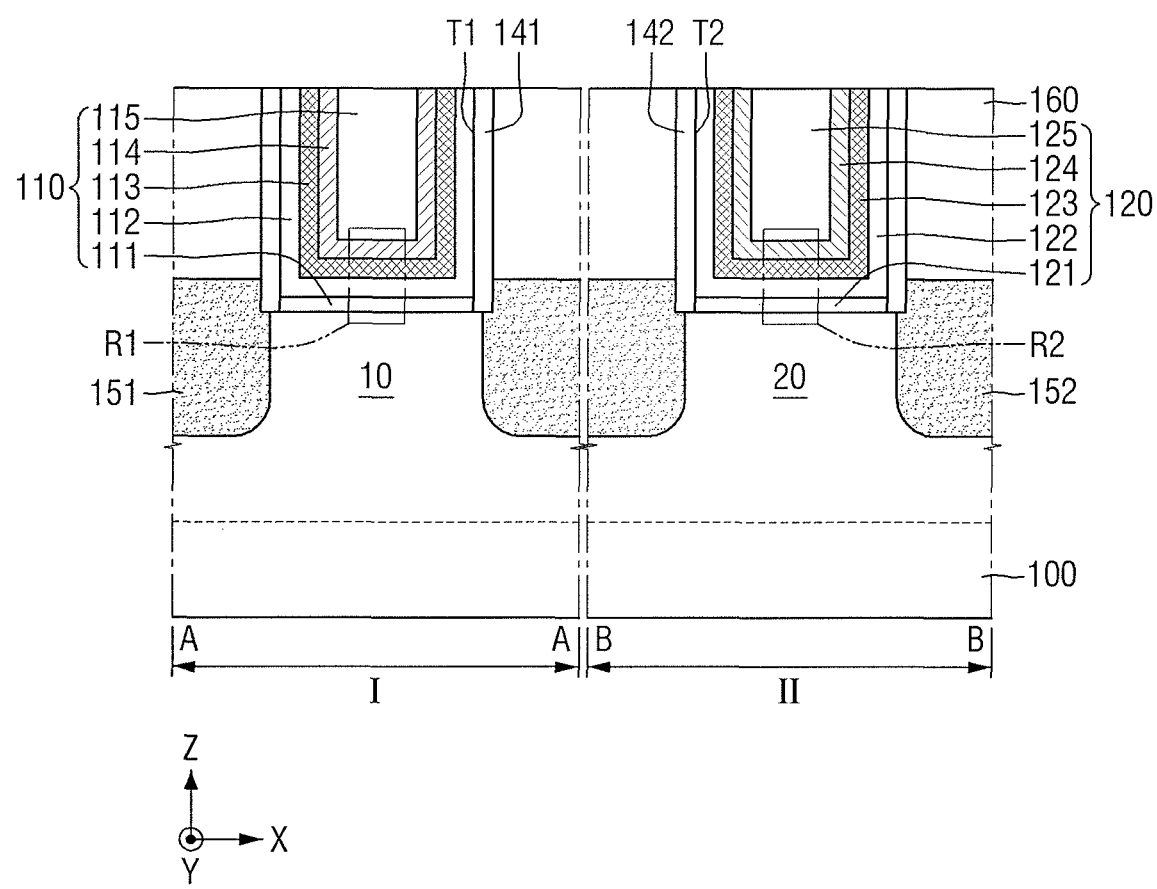
FIG. 2 illustrates a cross-sectional view taken on lines A-A and B-B in FIG. 1.
Figure 3:
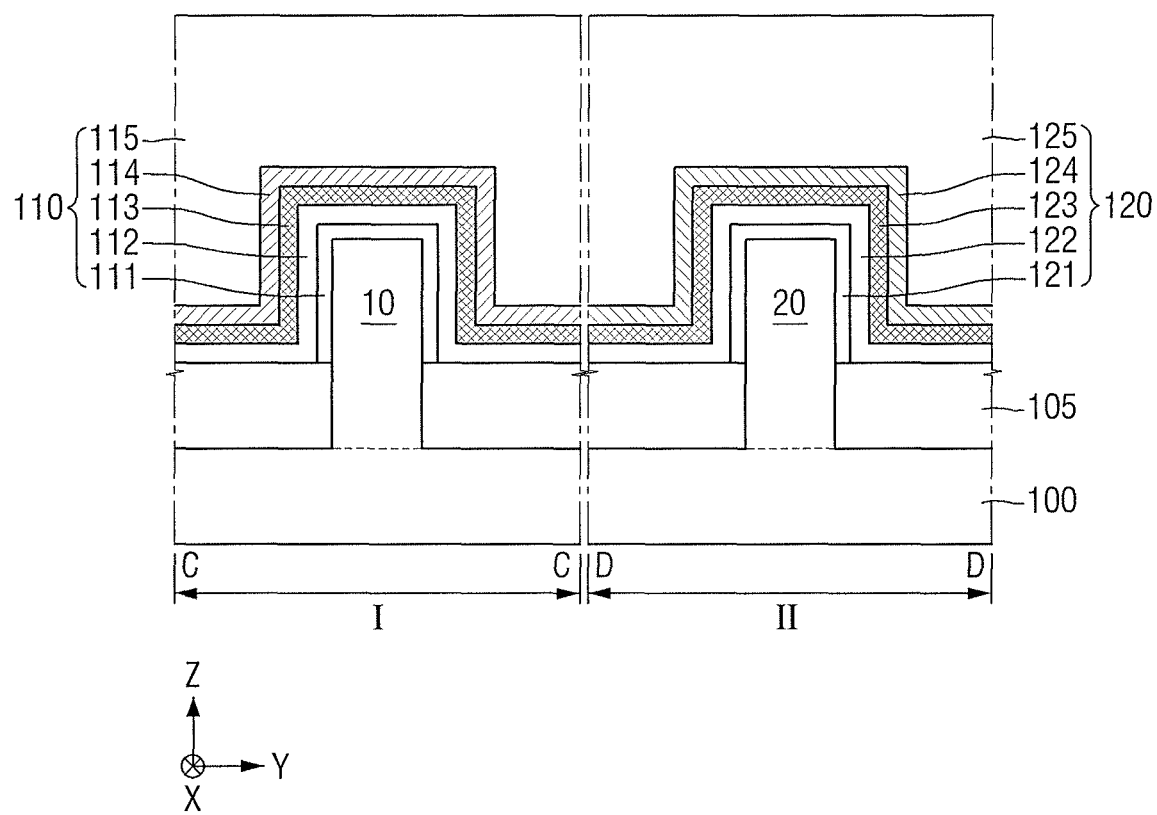
FIG. 3 illustrates a cross-sectional view taken on lines C-C and D-D in FIG. 1.
Figure 4:
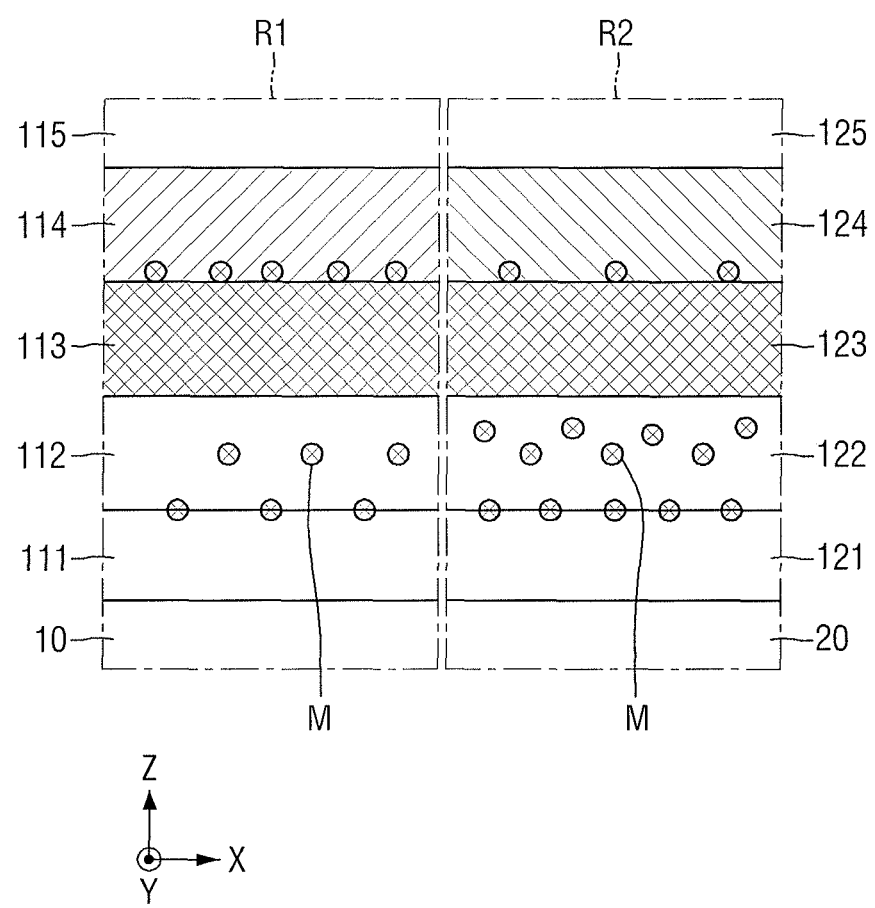
FIG. 4 illustrates an enlarged view of R1 and R2 in FIG. 2.

FIG. 1 illustrates a top view of a semiconductor device according to some exemplary embodiments. FIG. 2 illustrates a cross-sectional view taken on lines A-A and B-B in FIG. 1. FIG. 3 illustrates a cross-sectional view taken on lines C-C and D-D in FIG. 1. FIG. 4 illustrates an enlarged view of R1 and R2 in FIG. 2.

For reference, FIG. 1 schematically illustrates only a first active region 10, a second active region 20, a first gate structure 110, and a second gate structure for convenience of explanation.

Referring to FIG. 1 to FIG. 4, the semiconductor device according to some exemplary embodiments may include a substrate 100, a first active region 10, a second active region 20, a field insulating film 105, a first gate structure 110, a second gate structure 120, a first gate spacer 141, a second gate spacer 142, a first source/drain region 151, a second source/drain region 152, and an interlayer insulating film 160.

The substrate 100 may be bulk silicon or a silicon-on-insulator (SOI). In an implementation, the substrate 100 may be, e.g., a silicon substrate, or may include other materials such as silicon germanium, silicon germanium on insulator (SGOI), indium antimonide, lead telluride, indium arsenide, indium phosphide, gallium arsenide, or (e.g., and/or) gallium antimonide.

For convenience of explanation, exemplary embodiments will be described below based on assumption that the substrate 100 includes silicon.

The first active region 10 and the second active region 20 may be defined by the field insulating film 105. The first active region 10 and the second active region 20 may be separated spatially, but may be adjacent to each other.

The first active region 10 may be arranged on a first region I of the substrate 100 to extend (e.g., lengthwise) towards or along a first direction X. The second active region 20 may be spaced apart from the first active region 10 in a second direction Y on a second region (II) of the substrate 100, and may extend along the first direction X.

In an implementation, each of the first active region 10 and the second active region 20 may be, e.g., formed with a rectangular shape, extending lengthwise in the first direction (X). In an implementation, the first active region 10 and the second active region 20 may be adjacent to each other in a long side direction and arranged in parallel.

In an implementation, the field insulating film 105 may surround the first active region 10 and the second active region 20. The semiconductor device according to some exemplary embodiments will be described based on the assumption that the field insulating film 105 indicates a portion positioned between the first active region 10 and the second active region 20.

The field insulating film 105 may be arranged between the first active region 10 and the second active region 20, and may directly contact the first active region 10 and the second active region 20.

The field insulating film 105 may include, e.g., a silicon oxide film, a silicon nitride film, a silicon oxynitride film, or a combination thereof.

In an implementation, the field insulating film 105 may further include at least one field liner film between the first active region 10 and the field insulating film 105 and between the second active region 20 and the field insulating film 105.

When the field insulating film 105 further includes the field liner film, the field liner film may include, e.g., polysilicon, amorphous silicon, silicon oxynitride (SiON), silicon nitride (SiN), or silicon oxide ($SiO_2$).

The first gate spacer 141 may be arranged on the first region I of the substrate 100. The second gate spacer 142 may be arranged on the second region I of the substrate 100.

In an implementation, as illustrated in the drawings, the first gate spacer 141 and the second gate spacer 142 may be formed as a single layer. In an implementation, the first gate spacer 141 and the second gate spacer 142 may be also formed as a multi-layer.

The first gate spacer 141 and the second gate spacer 142 may include, e.g., silicon nitride (SiN), silicon oxynitride (SiON), silicon oxide ($SiO_2$), silicon oxycarbonitride (SiOCN), or a combination thereof.

When the first gate spacer 141 and the second gate spacer 142 include a plurality of films, at least one film included in the first gate spacer 141 and the second gate spacer 142 may include a low-k dielectric material such as silicon oxycarbonitride (SiOCN). In an implementation, when the first gate spacer 141 and the second gate spacer 142 include a plurality of films, at least one film included in the first gate spacer 141 and the second gate spacer 142 may have an L-shape.

In an implementation, the first gate spacer 141 and the second gate spacer 142 may serve as a guide for forming a self aligned contact. Accordingly, the first gate spacer 141 and the second gate spacer 142 may include a material having an etch selectivity with respect to the interlayer insulating film 160 which will be described below.

A first recess T1 may be defined by the first gate spacer 141, and may be formed on the first active region 10. For example, sidewalls of the first recess T1 may be defined by the first gate spacer 141, and a bottom surface thereof may be defined by an upper surface of the first active region 10. For example, the first gate spacer 141 may extend along the sidewalls of the first recess T1.

A second recess T2 may be defined by the second gate spacer 142, and may be formed on the second active region 20. For example, sidewalls of the second recess T2 may be defined by the second gate spacer 142, and a bottom surface thereof may be defined by an upper surface of the second active region 20. For example, the second gate spacer 142 may extend along the sidewalls of the second recess T2.

The interlayer insulating film 160 may be formed on the substrate 100. The interlayer insulating film 160 may surround an outer sidewall of the first gate spacer 141 that defines the first recess T1, and an outer sidewall of the second gate spacer 142 that defines the second recess T2.

In an implementation, the interlayer insulating film 160 may include, e.g., silicon oxide ($SiO_2$), silicon nitride (SiN), silicon oxynitride (SiON), flowable oxide (FOX), Tonen Silazene (TOSZ), undoped silica glass (USG), borosilica glass (BSG), phosphosilica glass (PSG), borophosphosilica glass (BPSG), plasma-enhanced tetraethyl orthosilicate (PE-TEOS), fluoride silicate glass (FSG), carbon doped silicon oxide (CDO), xerogel, aerogel, amorphous fluorinated carbon, organosilicate glass (OSG), parylene, bis-benzocyclobutenes (BCB), SILK, polyimide, porous polymeric material, or a combination thereof.

In an implementation, as illustrated in the drawings, the interlayer insulating film 160 may be a single layer. In an implementation, the interlayer insulating film 160 may include a plurality of layers to adjust profiles of the first recess T1 and the second recess T2.

The first gate structure 110 may be arranged on the first active region 10 to extend along the second direction Y (intersecting with the first direction X).

The first gate structure 110 may include, e.g., a first interface film 111, a first lower high-k dielectric film 112, a first upper high-k dielectric film 113, a first metal-containing film 114, and a first filling film 115.

The first gate structure 110 may be formed by stacking the first interface film 111, the first lower high-k dielectric film 112, the first upper high-k dielectric film 113, the first metal-containing film 114, and the first filling film 115 in sequence in the first recess T1.

An upper surface of the first gate structure 110 may be on the same plane as an upper surface of the interlayer insulating film 160 and an upper surface of the first gate spacer 141.

The first interface film 111 may be arranged on the first active region 10. The first interface film 111 may be arranged on or at the bottom surface of the first recess T1. In an implementation, as illustrated in the drawings, the first interface film 111 may not be formed on the sidewalls of the first recess T1. In an implementation, the first interface film 111 may be also arranged on the sidewalls of the first recess T1 depending on manufacturing method.

In an implementation, the first interface film 111 may include, e.g., silicon oxide ($SiO_2$). In an implementation, according to the kind of the substrate 100 or the kind of the first lower high-k dielectric film 112, the first interface film 111 may also include other materials.

The first lower high-k dielectric film 112 may be arranged on the first interface film 111. The first lower high-k dielectric film 112 may be arranged along the upper surface of the first interface film 111 and the sidewalls of the first recess T1.

The first lower high-k dielectric film 112 may include a first high-k dielectric material M (in a first concentration) and a second high-k dielectric material that is different from the first high-k dielectric material M.

In an implementation, the first high-k dielectric material M may be, e.g., a high-k silicate (including scandium (Sc), yttrium (Y), or lanthanum (La)), a high-k oxynitride, or a high-k silicon oxynitride.

In an implementation, the second high-k dielectric material may be, e.g., a high-k silicate (including hafnium (Hf), zirconium (Zr), titanium (Ti), tantalum (Ta), or aluminum (Al)), a high-k oxynitride, or a high-k silicon oxynitride.

The first upper high-k dielectric film 113 may be arranged on the first lower high-k dielectric film 112 in the first recess T1. The first upper high-k dielectric film 113 may include the first high-k dielectric material M.

The first metal-containing film 114 may be arranged on the first upper high-k dielectric film 113 in the first recess T1. In an implementation, the first metal-containing film 114 may have a thickness of, e.g., 3 nm or less.

The first metal-containing film 114 may include, e.g., silicon (Si) in a third concentration. The first metal-containing film 114 may include, e.g., the first high-k dielectric material M in a seventh concentration.

The first metal-containing film 114 may be or may include, e.g., a metal nitride (including titanium (Ti) or tantalum (Ta)), a metal oxynitride, a metal carbide, a metal oxycarbide, or a metal oxynitride carbide.

In an implementation, as illustrated in the drawings, the first metal-containing film 114 may be formed as a single layer. In an implementation, the first metal-containing film 114 may include a plurality of layers.

The first filling film 115 may be arranged on the first metal-containing film 114 to fill an inside of the first recess T1.

The first filling film 115 may include, e.g., W, Al, Co, Cu, Ru, Ni, Pt, or Ni—Pt.

In an implementation, as illustrated in the drawings, the first filling film 115 may be formed as a single layer. In an implementation, the first filling film 115 may include a plurality of layers.

The second gate structure 120 may be arranged on the second active region 20 and may extend along the second direction Y.

The second gate structure 120 may include, e.g., a second interface film 121, a second lower high-k dielectric film 122, a second upper high-k dielectric film 123, a second metal-containing film 124, and a second filling film 125.

The second gate structure 120 may be formed by stacking the second interface film 121, the second lower high-k dielectric film 122, the second upper high-k dielectric film 123, the second metal-containing film 124, and the second filling film 125 in sequence in the second recess T2.

An upper surface of the second gate structure 120 may be on the same plane as an upper surface of the interlayer insulating film 160 and an upper surface of the second gate spacer 142.

The second interface film 121 may be arranged on the second active region 20. The second interface film 121 may be arranged on or at the bottom surface of the second recess T2. In an implementation, as illustrated in the drawings, the second interface film 121 may not be formed on the sidewalls of the second recess T2. In an implementation, the second interface film 121 may be also arranged on the sidewalls of the second recess T2 depending on manufacturing method.

In an implementation, the second interface film 121 may include, e.g., silicon oxide ($SiO_2$). In an implementation, according to the kind of the substrate 100 or the kind of the second lower high-k dielectric film 122, the second interface film 121 may also include other materials.

The second lower high-k dielectric film 122 may be arranged on the second interface film 121. The second lower high-k dielectric film 122 may be arranged along the upper surface of the second interface film 121 and the sidewalls of the second recess T2.

The second lower high-k dielectric film 122 may include, e.g., the first high-k dielectric material M (in a second concentration that is greater than the first concentration) and the second high-k dielectric material.

The second upper high-k dielectric film 123 may be arranged on the second lower high-k dielectric film 122 in the second recess T2. The second upper high-k dielectric film 123 may include, e.g., the first high-k dielectric material M.

The second metal-containing film 124 may be arranged on the second upper high-k dielectric film 123 in the second recess T2. In an implementation, the second metal-containing film 124 may have a thickness of, e.g., 3 nm or less.

The second metal-containing film 124 may include silicon (Si) in a fourth concentration that is smaller than the third concentration. In an implementation, the second metal-containing film 124 may not include silicon, e.g., the fourth concentration may be 0. The first metal-containing film 114 may include the first high-k dielectric material M in an eighth concentration that is smaller than the seventh concentration.

The second metal-containing film 124 may be, e.g., a metal nitride (including titanium (Ti) or tantalum (Ta)), a metal oxynitride, a metal carbide, a metal oxycarbide, or a metal oxynitride carbide.

In an implementation, as illustrated in the drawings, the second metal-containing film 124 may be formed as a single layer. In an implementation, the second metal-containing film 124 may also include a plurality of layers.

The second filling film 125 may be arranged on the second metal-containing film 124 to fill an inside of the second recess T2.

The second filling film 125 may include, e.g., W, Al, Co, Cu, Ru, Ni, Pt, or Ni—Pt.

In an implementation, as illustrated in the drawings, the second filling film 125 may be formed as a single layer. In an implementation, the second filling film 125 may also include a plurality of layers.

Referring to FIG. 4, the fourth concentration of the silicon (Si) included in the second metal-containing film 124 may be smaller than the third concentration of the silicon (Si) included in the first metal-containing film 114.

For example, the second metal-containing film 124 may include a smaller amount of silicon (Si) than the amount of silicon (Si) in the first metal-containing film 114. In an implementation, the fourth concentration of silicon (Si) included in the second metal-containing film 124 may be 0. For example, the second metal-containing film 124 may not include silicon (Si).

The second concentration of the first high-k dielectric material M included in the second lower high-k dielectric film 122 may be greater than the first concentration of the first high-k dielectric material M included in the first lower high-k dielectric film 112. For example, the second lower high-k dielectric film 122 may include a greater amount of first high-k dielectric material M than the first lower high-k dielectric film 112.

The eighth concentration of the first high-k dielectric material M included in the second metal-containing film 124 may be smaller than the seventh concentration of the first high-k dielectric material M included in the first metal-containing film 114. For example, the second metal-containing film 124 may include a smaller amount of first high-k dielectric material M than the first metal-containing film 114.

A boundary surface or area between the second interface film 121 and the second lower high-k dielectric film 122 may include a greater amount of first high-k dielectric material M than a boundary surface or area between the first interface film 111 and the first lower high-dielectric film 112.

A difference in the concentration of the first high-k dielectric material M between the first lower high-k dielectric film 112 and the second lower high-k dielectric film 122, and a difference in the concentration of the first high-k dielectric material M between the first metal-containing film 114 and the second metal-containing film 124 may be attributable to a difference in the concentration of silicon (Si) between the first metal-containing film 114 and the second metal-containing film 124.

In the fabrication process of the semiconductor device according to some exemplary embodiment, a diffusion process may be performed on each of the first metal-containing film 114 including silicon (Si) in the third concentration and the second metal-containing film 124 including silicon (Si) in the fourth concentration (which is smaller than the third concentration) such that the amount of first high-k dielectric material M diffused from the second upper high-k dielectric film 123 into the second lower high-k dielectric film 122 may be greater than the amount of first high-k dielectric material M diffused from the first upper high-k dielectric film 113 into the first lower high-k dielectric film 112.

In addition, the diffusion process may be performed on the first metal-containing film 114 and the second metal-containing film 124, such that the amount of first high-k dielectric material M diffused from the first upper high-k dielectric film 113 into the first metal-containing film 114 may be greater than the amount of first high-k dielectric material M diffused from the second upper high-k dielectric film 123 into the second metal-containing film 124.

As a result, the semiconductor device according to some exemplary embodiments may provide various threshold voltages (Vt) by modulating a work function, by adjusting the concentration of the first high-k dielectric material M included in the first lower high-k dielectric film 112 and the second lower high-k dielectric film 122 using the first metal-containing film 114 and the second metal-containing film 124 including silicon (Si) of different concentrations.

Referring back to FIG. 1 to FIG. 3, the first source/drain region 151 may be formed adjacent to the first gate structure 10. The second source/drain region 152 may be formed adjacent to the second gate structure 120.

In an implementation, as illustrated in the drawings, the first source/drain region 151 and the second source/drain region 152 may be impurity regions formed in the substrate 100. In an implementation, the first source/drain region 151 and the second source/drain region 152 may include an epitaxial layer formed on or in the substrate 100.

In an implementation, each of the first source/drain region 151 and the second source/drain region 152 may be an elevated source/drain region including an upper surface which protrudes upward further than the upper surface of each of the first active region 10 and the second active region 20.

Hereinafter, a method for fabricating a semiconductor device according to some exemplary embodiments will be described with reference to FIG. 5 to FIG. 12.

FIG. 5 to FIG. 12 illustrate views of stages in a method for fabricating a semiconductor device according to some exemplary embodiments.

Figure 5:
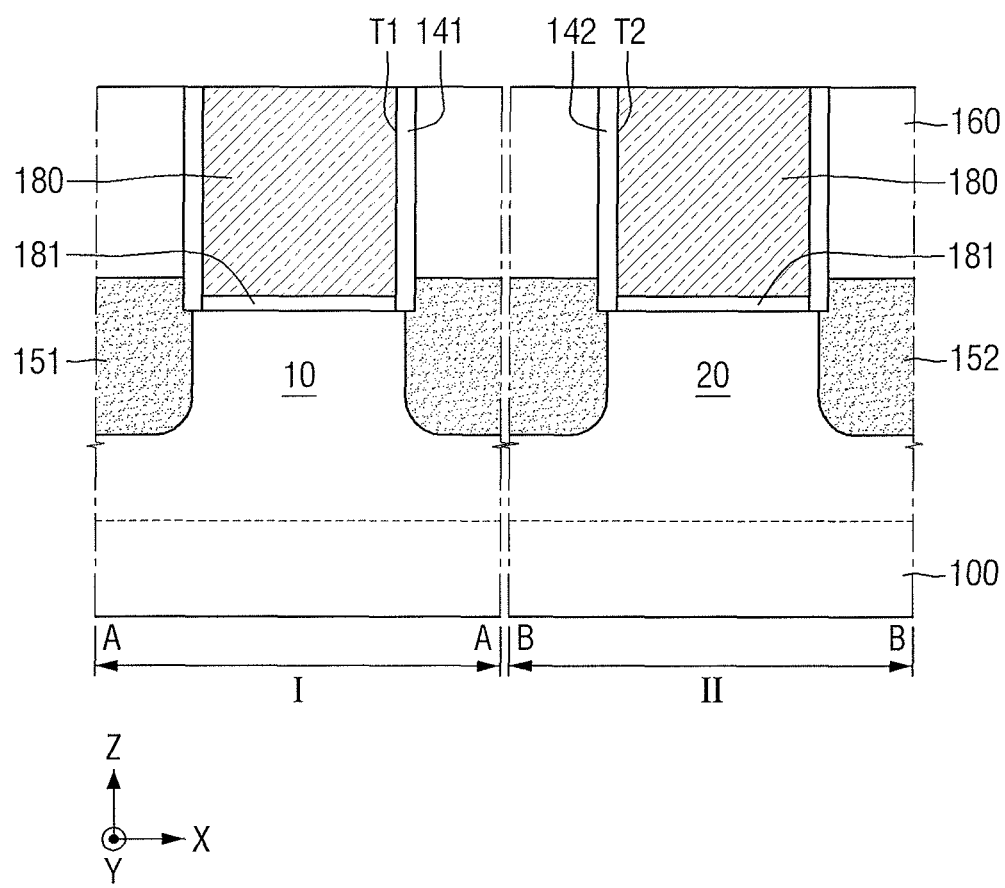
FIG. 5 to FIG. 12 illustrate views of stages in a method for fabricating a semiconductor device according to some exemplary embodiments of the present disclosure.

Referring to FIG. 5, a dummy gate insulating film 181 and a dummy gate electrode 180 may be sequentially stacked on the substrate 100.

The dummy gate insulating film 181 may include silicon oxide ($SiO_2$), silicon oxynitride (SiON), or a combination thereof. The dummy gate electrode 180 may be, e.g., silicon. In an implementation, the dummy gate electrode 180 may include, e.g., polycrystalline silicon (poly Si), amorphous silicon (a-Si), or a combination thereof. The dummy gate electrode 180 may be doped without impurity, or may be doped with impurity.

A first gate spacer 141 and a second gate spacer 142 may be formed on sidewalls of the dummy gate electrode 180 and the dummy gate insulating film 181.

For example, the first gate spacer 141 may be formed on the sidewalls of the dummy gate electrode 180 and the dummy gate insulating film 181 at a first region I of the substrate 100, and the second gate spacer 142 may be formed on the sidewalls of the dummy gate electrode 180 and the dummy gate insulating film 181 at a second region II of the substrate 100.

After the first gate spacer 141 and the second gate spacer 142 are formed, a first source/drain region 151 and a second source/drain region 152 may be formed adjacent to the dummy gate electrode 180.

For example, the first source/drain region 151 may be formed adjacent to the dummy gate electrode 180 at the first region I of the substrate 100, and the second source/drain region 152 may be formed adjacent to the dummy gate electrode 180 at the second region II of the substrate 100.

An interlayer insulating film 160 may be formed on the substrate 100 to cover the dummy gate electrode 180. The interlayer insulating film 160 may be planarized to expose an upper surface of the dummy gate electrode 180, the first gate spacer 141, and the second gate spacer 142.

Figure 6:
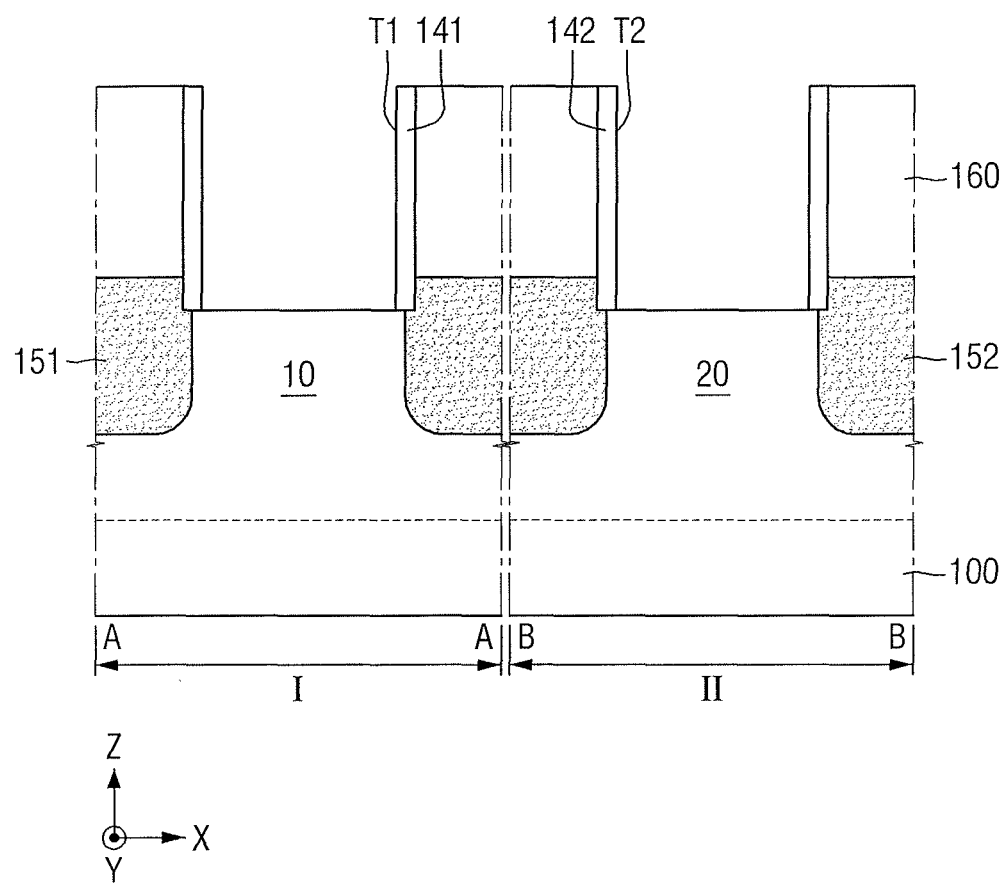

Referring to FIG. 6, the dummy gate insulating film 181 and the dummy gate electrode 180 may be removed. The dummy gate insulating film 181 and the dummy gate electrode 180 may be removed, such that a first recess T1 intersecting with a first active region 10 is formed on the first active region 10, and a second recess T2 intersecting with a second active region 20 is formed on the second active region 20.

The interlayer insulating film 160 may include the first recess T1 defined by the first gate spacer 141, and the second recess T2 defined by the second gate spacer 142.

Figure 7:
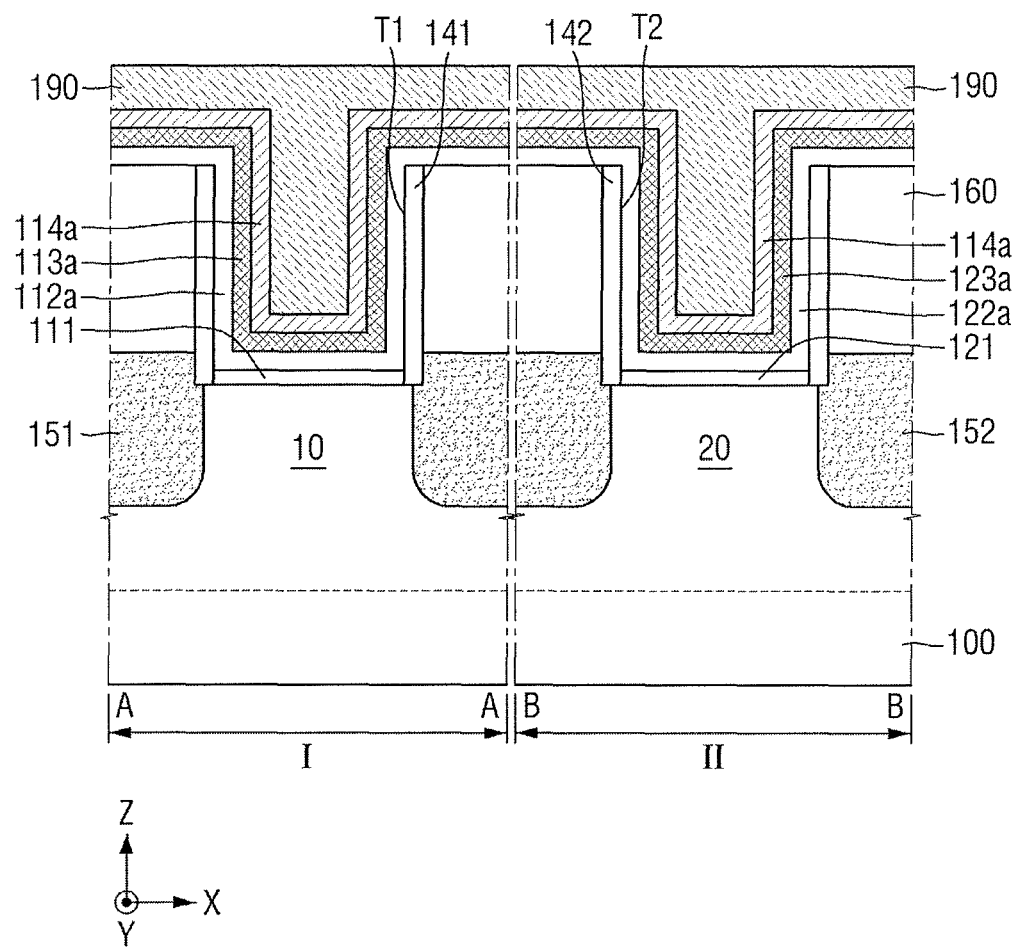

Referring to FIG. 7, a first interface film 111, a first lower high-k dielectric film 112*a*, a first upper high-k dielectric film 113*a*, a first metal-containing film 114*a*, and a silicon film 190 (e.g., film that includes silicon) may be stacked in sequence on the first region I of the substrate 100. In addition, a second interface film 121, a second lower high-k dielectric film 122*a*, a second upper high-k dielectric film 123*a*, a first metal-containing film 114*a*, and the silicon film 190 may be stacked in sequence on the second region II of the substrate 100.

For example, the first interface film 111 may be formed on or at the bottom surface of the first recess T1, and the second interface film 121 may be formed on or at the bottom surface of the second recess T2.

The first lower high-k dielectric film 112*a* (including a second high-k dielectric material) may be formed on the first interface film 111, sidewalls of the first recess T1, an upper surface of the first gate spacer 141, and an upper surface of the interlayer insulating film 160. The second lower high-k dielectric film 122*a* (including the second high-k dielectric material) may be formed on the second interface film 121, sidewalls of the second recess T2, an upper surface of the second gate spacer 142, and the upper surface of the interlayer insulating film 160.

The first upper high-k dielectric film 113*a* (including a first high-k dielectric material (M in FIG. 4)) may be formed on the first lower high-k dielectric film 112*a* along a profile of the first lower high-k dielectric film 112*a*, and the second upper high-k dielectric film 123*a* (including the first high-k dielectric material (M in FIG. 4)) may be formed on the second lower high-k dielectric film 122*a* along a profile of the second lower high-k dielectric film 122*a*.

The first metal-containing film 114*a* (including silicon (Si) in a third concentration) may be formed on the first upper high-k dielectric film 113*a* and the second upper high-k dielectric film 123*a* along a profile of each of the first upper high-k dielectric film 113*a* and the second upper high-k dielectric film 123*a*.

In an implementation, the first metal-containing film 114*a* may be formed by, e.g., atomic layer deposition (ALD), chemical vapor deposition (CVD), or sputtering process.

The silicon film 190 (including silicon (Si)) may be formed on the first metal-containing film 114*a*. In an implementation, as illustrated in FIG. 7, the silicon film 190 may fill the first recess T1 and the second recess T2 on the first metal-containing film 114*a*. In an implementation, the silicon film 190 may be formed on the first metal-containing film 114*a* along a profile of the first metal-containing film 114*a*.

In an implementation, the silicon film 190 may include, e.g., oxygen (O), carbon (C), or nitrogen (N), in addition to silicon (Si).

Figure 8:
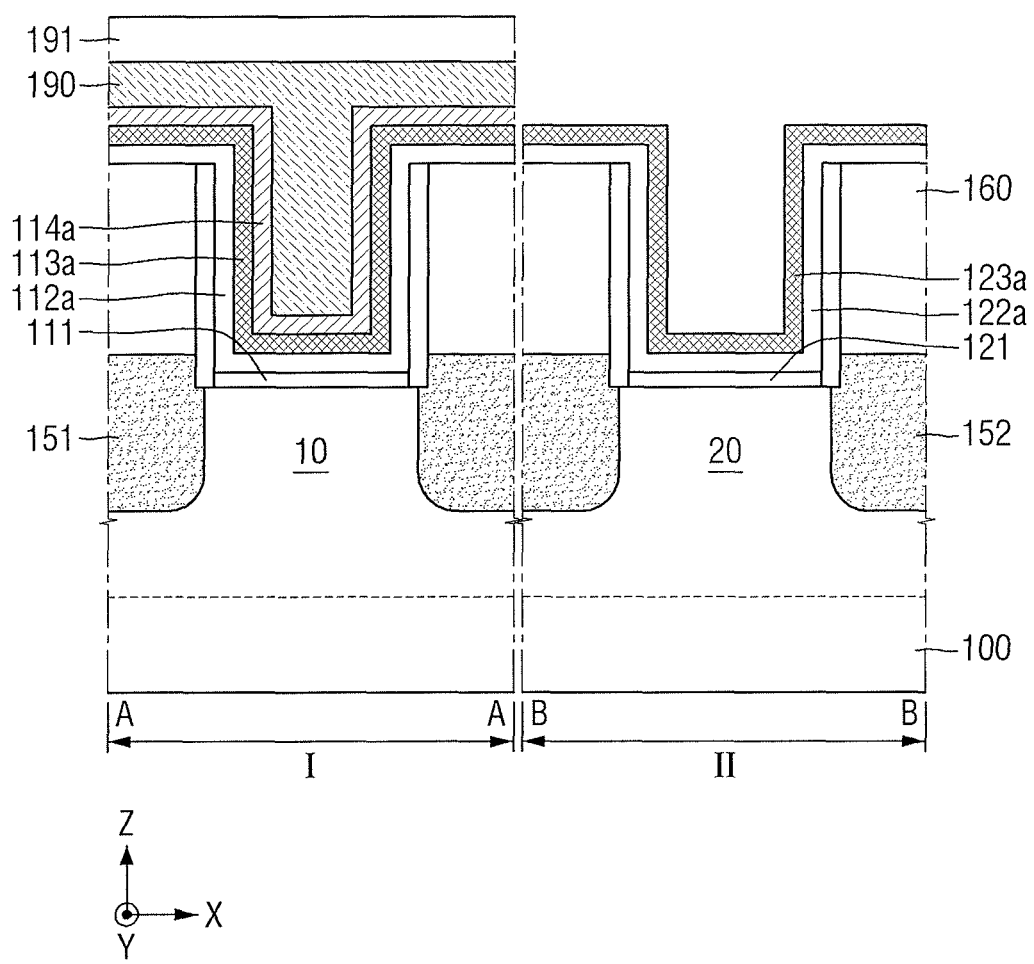

Referring to FIG. 8, a first mask pattern 191 may be formed on the silicon film 190 on the first region I of the substrate 100, and the silicon film 190 and the first metal-containing film 114*a* on the second region H of the substrate 100 may be removed by using the first mask pattern 191 as a mask.

Figure 9:
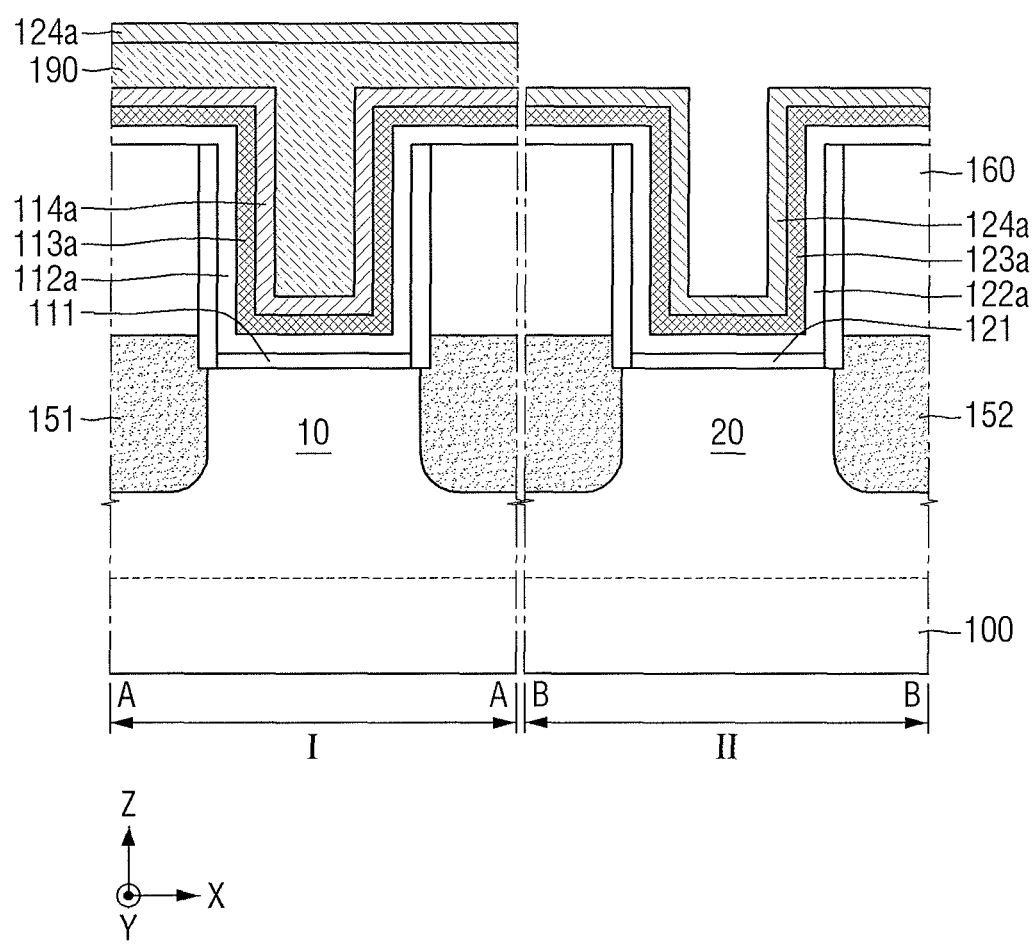

Referring to FIG. 9, a second metal-containing film 124*a* (including silicon (Si) in a fourth concentration that is smaller than the third concentration) may be formed on the silicon film 190 on the first region I of the substrate 100 and on the second upper high-k dielectric film 123*a* on the second region II of the substrate 100.

In an implementation, the second metal-containing film 124*a* may be formed by, e.g., atomic layer deposition (ALD), chemical vapor deposition (CVD), or sputtering process.

Figure 10:
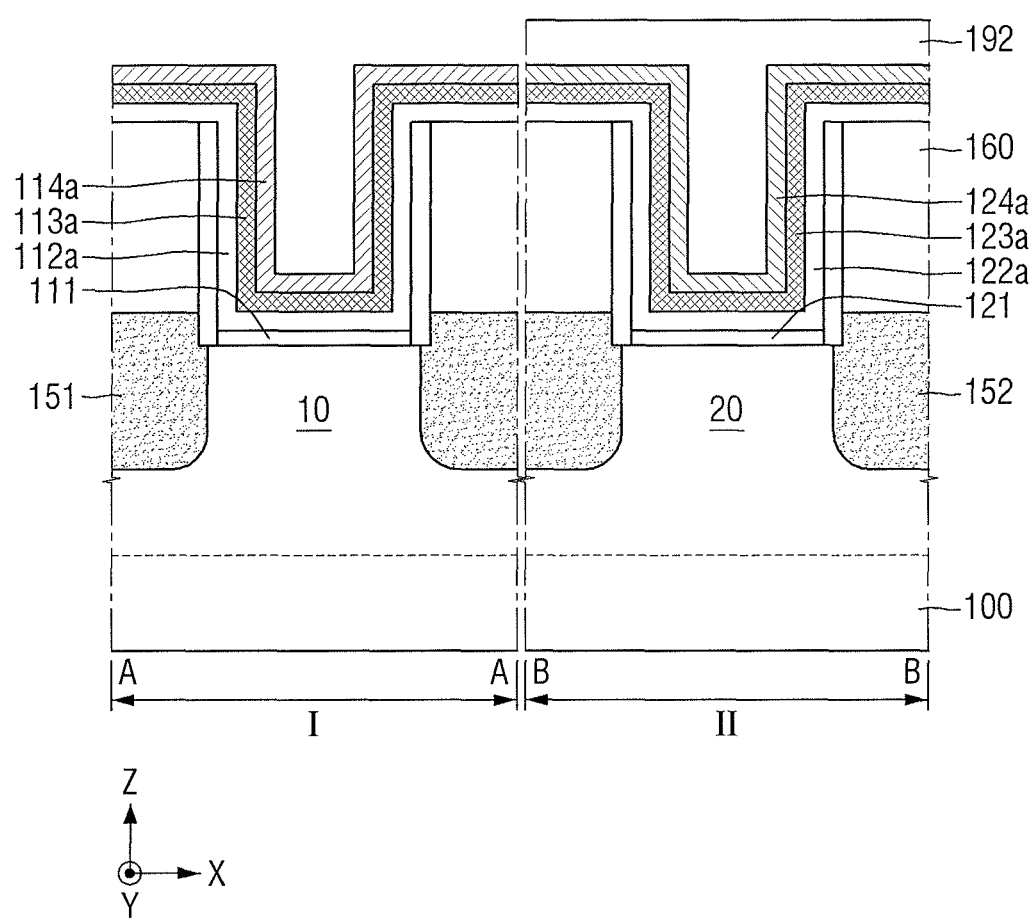

Referring to FIG. 10, a second mask pattern 192 may be formed on the second metal-containing film 124*a* (on the second region II of the substrate 100), and portions of the second metal-containing film 124*a* and the silicon film 190 (on the first region I of the substrate 100) may be removed by using the second mask pattern 192 as a mask.

Figure 11:
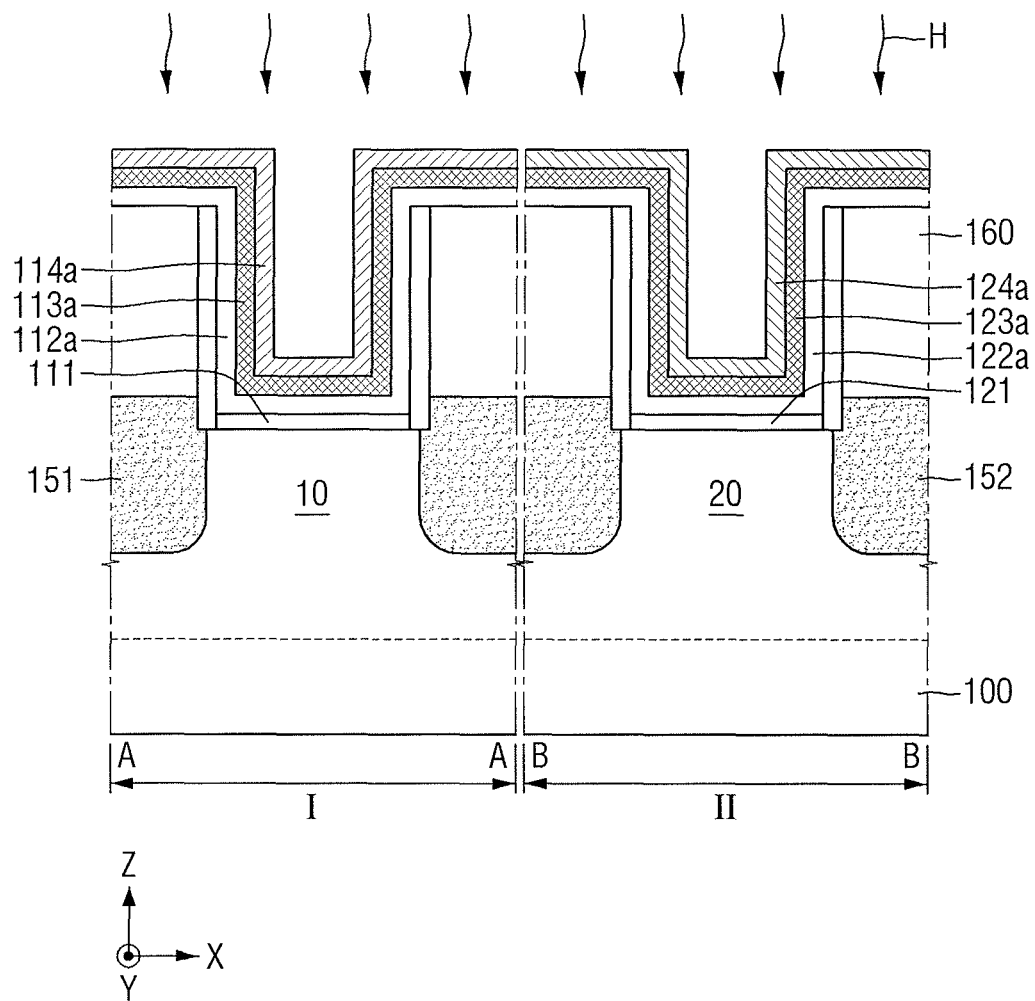

Referring to FIG. 11, after the second mask pattern 192 is removed from the second region (II) of the substrate 100, a diffusion process H may be performed on or using the first high-k dielectric material (M in FIG. 4) onto the first metal-containing film 114*a* and the second metal-containing film 124*a*.

In an implementation, the diffusion process H may include, e.g., a plasma treatment process, an annealing process, an ultraviolet (UV) treatment process, or a combination thereof.

As a result of the diffusion process, the first high-k dielectric material (M in FIG. 4) may be diffused into the first lower high-k dielectric film 112*a*, the second lower high-k dielectric film 122*a*, the first metal-containing film 114*a*, and the second metal-containing film 124*a*, respectively, as depicted in FIG. 4.

Figure 12:
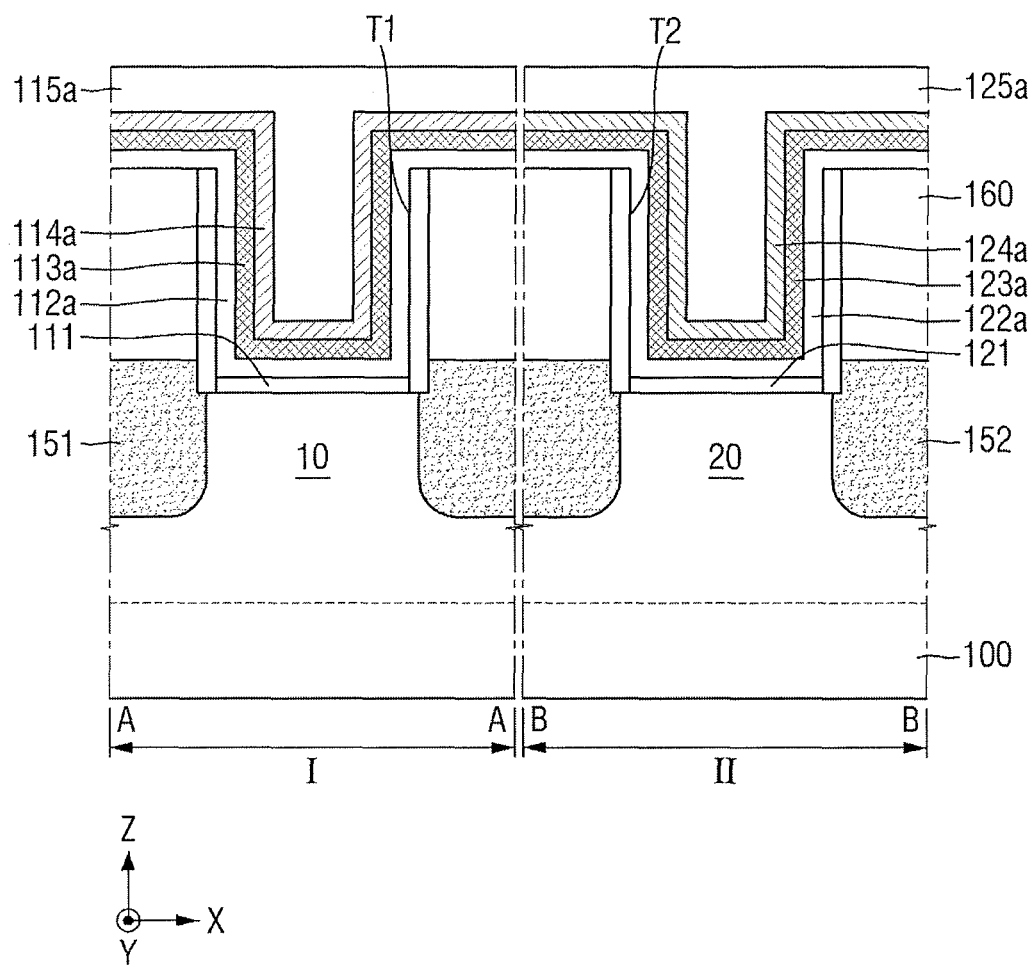

Referring to FIG. 12, a first filling film 115*a* may be formed on the first metal-containing film 114*a*, and a second filling film 125*a* may be formed on the second metal-containing film 124*a*.

The first filling film 115*a* may fill the first recess T1, and the second filling film 125*a* may fill the second recess T2.

Next, portions of the first and second lower high-k dielectric films 112*a* and 122*a*, the first and second upper high-k dielectric films 113*a* and 123*a*, the first and second metal-containing films 114*a* and 124*a*, the first and second filling films 115*a* and 125*a* formed on the upper surface of the interlayer insulating film 160 may be removed, and then the semiconductor device illustrated in FIG. 2 is fabricated.

Hereinbelow, a semiconductor device according to some exemplary embodiments will be described with reference to FIG. 13. The difference from the semiconductor device illustrated in FIG. 2 will be highlighted.

Figure 13:
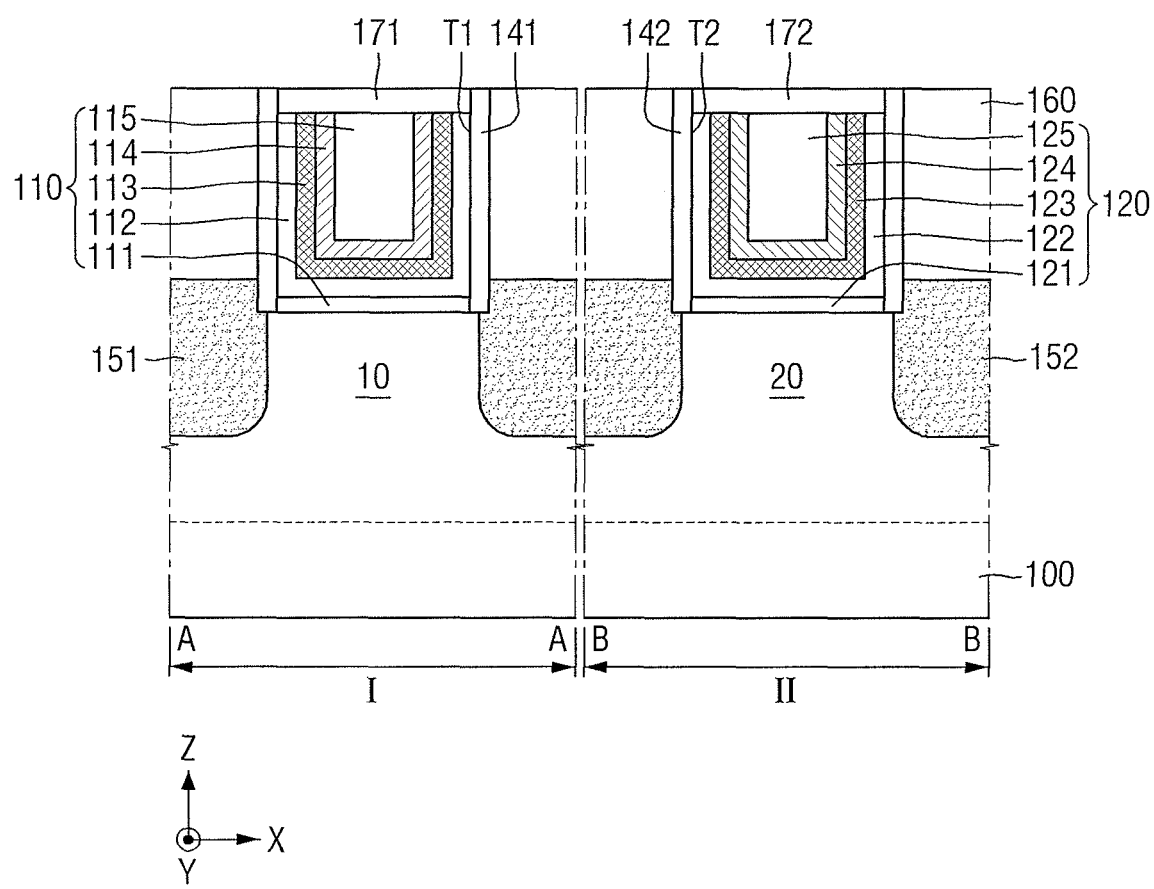
FIG. 13 illustrates a view of a semiconductor device according to some exemplary embodiments of the present disclosure.

FIG. 13 illustrates a view of a semiconductor device according to some exemplary embodiments.

Referring to FIG. 13, the semiconductor device according to some exemplary embodiments may further include a first capping pattern 171 on the first gate structure 110, and a second capping pattern 172 on the second gate structure 120.

The first gate structure 110 may fill a portion of the first recess T1. An upper surface of the first gate structure 110 may be more adjacent to or closer to the substrate 100 than the upper surface of the interlayer insulating film 160.

The first capping pattern 171 may be formed on the first gate structure 110 to fill the other or remaining portion of the first recess T1. An upper surface of the first capping pattern 171 may be on the same plane as the upper surface of the first gate spacer 141 and the upper surface of the interlayer insulating film 160.

The second gate structure 120 may fill a portion of the second recess T2. An upper surface of the second gate structure 120 may be more adjacent to or closer to the substrate 100 than the upper surface of the interlayer insulating film 160.

The second capping pattern 172 may be formed on the second gate structure 120 to fill the other or remaining portion of the second recess T2. An upper surface of the second capping pattern 172 may be on the same plane as the upper surface of the second gate spacer 142 and the upper surface of the interlayer insulating film 160.

The first capping pattern 171 and the second capping pattern 172 may serve as a guide for forming a self-aligned contact, and they may include a material having an etch selectivity with respect to the interlayer insulating film 160. In an implementation, the first capping pattern 171 and the second capping pattern 172 may each include, e.g., silicon nitride (SiN), silicon oxynitride (SiON), silicon oxide (SiO$_2$), silicon carbon nitride (SiCN), silicon oxycarbon nitride (SiOCN), or a combination thereof.

Hereinbelow, a semiconductor device according to some exemplary embodiments will be described with reference to FIG. 14. The difference from the semiconductor devices illustrated in FIG. 2 and FIG. 13 will be highlighted.

Figure 14:
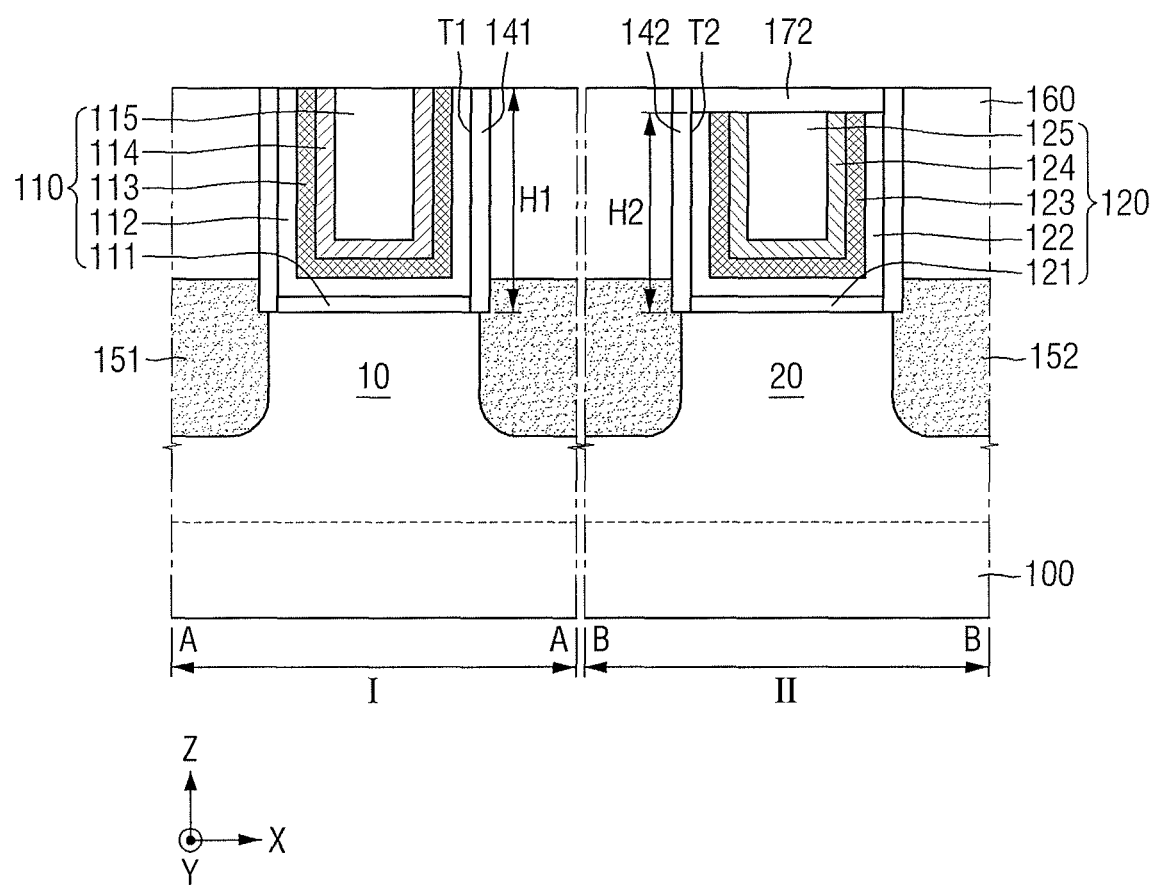
FIG. 14 illustrates a view of a semiconductor device according to some exemplary embodiments of the present disclosure.

FIG. 14 illustrates a view of a semiconductor device according to some exemplary embodiments.

Referring to FIG. 14, the semiconductor device according to some exemplary embodiments may include a second capping pattern 172 on the second gate structure 120.

The second capping pattern 172 may not be formed on the first gate structure 110 and may only be formed on the second gate structure, such that a first height H1 of the first gate structure 110 (in a third direction Z perpendicular to the first and second directions X and Y) may be higher than a second height H2 of the second gate structure 120 in the third direction Z (e.g., when measured from the first or second active region 10 or 20.

In an implementation, the second capping pattern 172 may not be formed on the second gate structure 120 and may only be formed on the first gate structure, such that the height of the second gate structure 120 in the third direction Z may be higher than the height of the first gate structure 110 in the third direction Z.

Hereinbelow, a semiconductor device according to some exemplary embodiments will be described with reference to FIG. 15. The difference from the semiconductor device illustrated in FIG. 2 will be highlighted.

Figure 15:
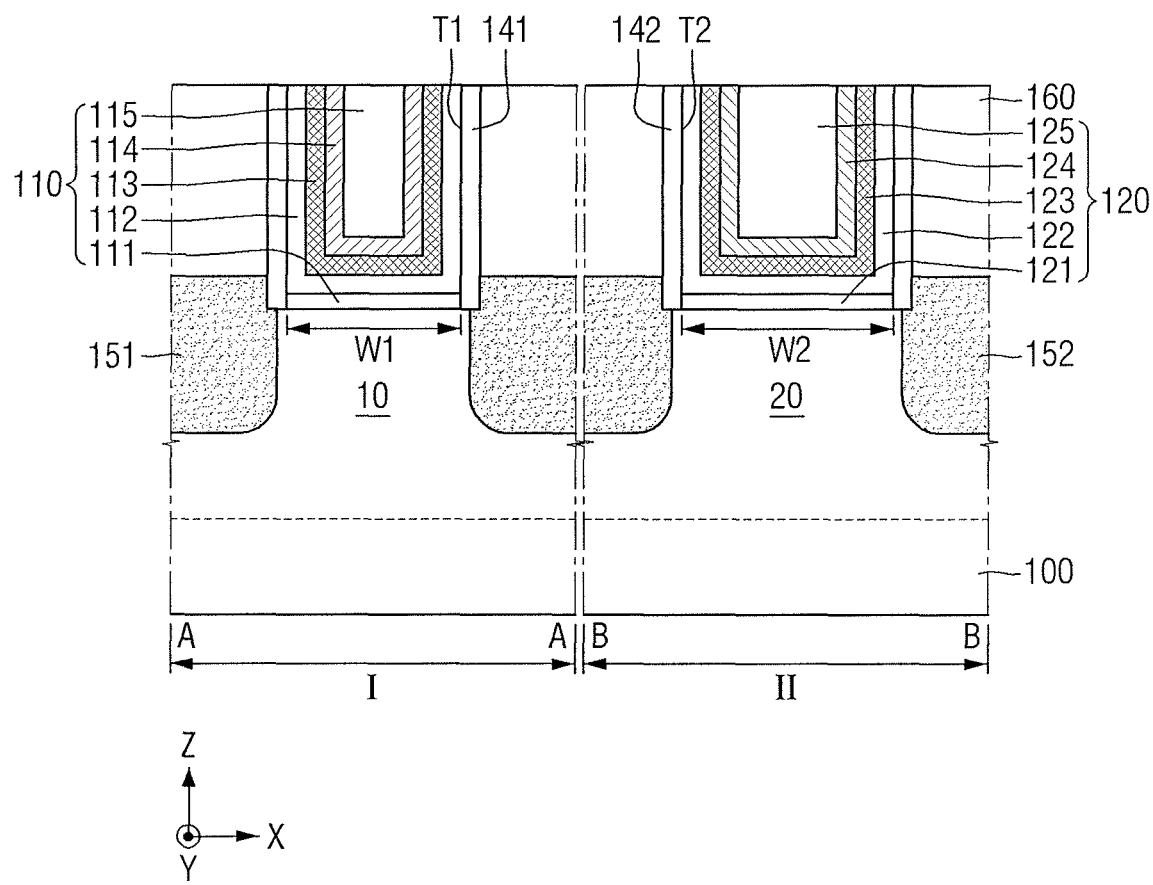
FIG. 15 illustrates a view of a semiconductor device according to some exemplary embodiments of the present disclosure.

FIG. 15 illustrates a view of a semiconductor device according to some exemplary embodiments.

Referring to FIG. 15, in the semiconductor device according to some exemplary embodiments, a second width W2 of the second gate structure 120 in the first direction X may be wider than a first width W1 of the first gate structure 110 in the first direction X.

In an implementation, the width of the first gate structure 110 in the first direction X may be wider than the width of the second structure 120 in the first direction X.

Hereinbelow, a semiconductor device according to some exemplary embodiments will be described with reference to FIG. 16 and FIG. 17. The difference from the semiconductor device illustrated in FIG. 2 will be highlighted.

Figure 16:
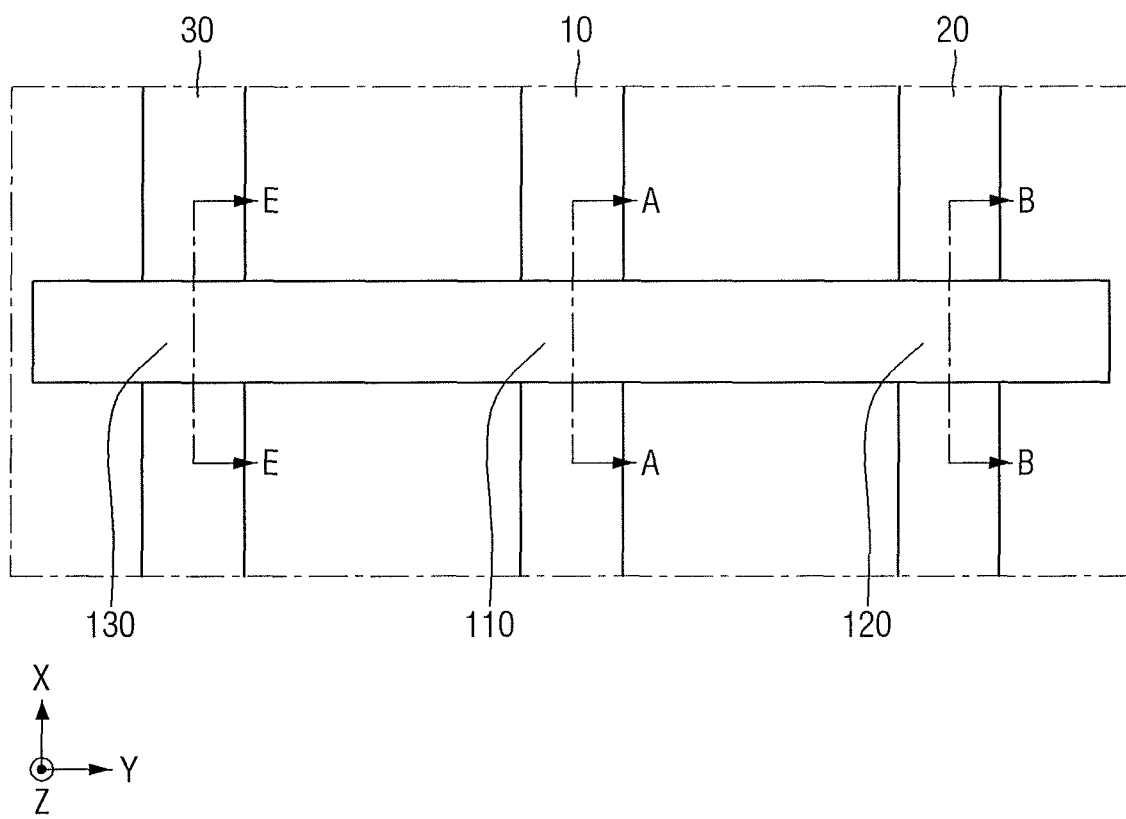
FIG. 16 illustrates a top view of a semiconductor device according to some exemplary embodiments of the present disclosure.

FIG. 16 illustrates a top view of a semiconductor device according to some exemplary embodiments. FIG. 17 illustrates a cross-sectional view taken on lines A-A, B-B, and E-E in FIG. 16.

Figure 17:
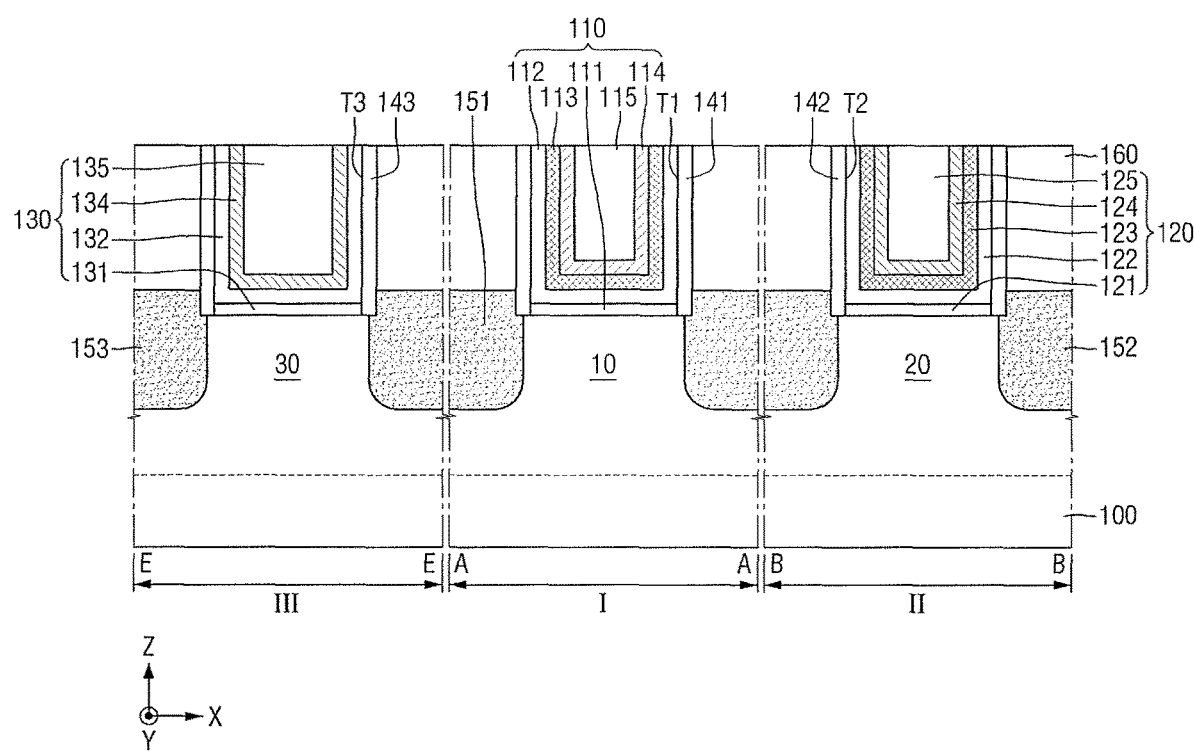
FIG. 17 illustrates a cross-sectional view taken on lines A-A, B-B, and E-E in FIG. 16.

Referring to FIG. 16 and FIG. 17, the semiconductor device according to some exemplary embodiments may further include a third gate structure 130 on a third region III of the substrate 100. The third gate structure 130 may not include an upper high-k dielectric film including the first high-k dielectric material.

For example, the semiconductor device according to some exemplary embodiments may further include a third active region 30 (which is spaced from the first and second active regions 10 and 20 on the substrate 100 in the second direction Y, and is arranged in parallel therewith), a third recess T3 on the third active region to intersect with the third active region 30, the third gate structure 130 inside the third recess T3, a third gate spacer 143 along sidewalls of the third gate structure 130, and a third source/drain region 153 in the substrate 100 adjacent to the third gate structure 130.

The third gate structure 130 may be formed by stacking a third interface film 131, a third lower high-k dielectric film 132, a third metal-containing film 134, and a third filling film 135 in sequence in the third recess T3.

The third interface film 131 may be arranged on or at the bottom surface of the third recess T3.

The third lower high-k dielectric film 132 may be arranged on the third interface film 131. The third lower high-k dielectric film 132 may be arranged along an upper surface of the third interface film 131 and sidewalls of the third recess T3. The third lower high-k dielectric film 132 may include the second high-k dielectric material.

The third metal-containing film 134 may be arranged on the third lower high-k dielectric film 132 to directly contact the third lower high-k dielectric film 132 in the third recess T3. The third metal-containing film 134 may include silicon (Si) in a fifth concentration (which is smaller than the third concentration of the silicon (Si) included in the first metal-containing film 114).

In an implementation, the fourth concentration of silicon (Si) included in the second metal-containing film 124 may be, e.g., the same as the fifth concentration of silicon (Si) included in the third metal-containing film 134.

Hereinbelow, a semiconductor device according to some exemplary embodiments will be described with reference to FIG. 18. The difference from the semiconductor devices illustrated in FIG. 2 and FIG. 17 will be highlighted.

Figure 18:
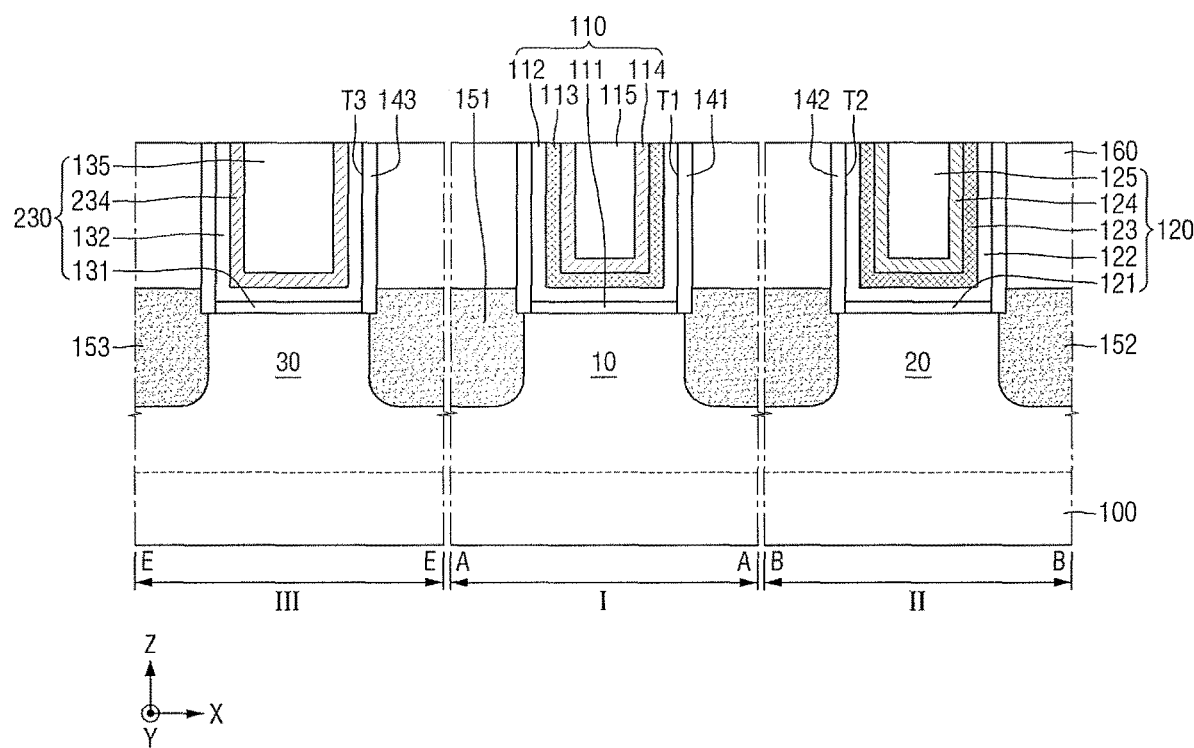
FIG. 18 illustrates a view of a semiconductor device according to some exemplary embodiments of the present disclosure.

FIG. 18 illustrates a view of a semiconductor device according to some exemplary embodiments.

Referring to FIG. 18, in the semiconductor device according to some exemplary embodiments, a third gate structure 230 on the third region III of the substrate 100 may include a third metal-containing film 234 (including silicon (Si) in a sixth concentration that is greater than the fourth concentration of the silicon (Si) included in the second metal-containing film 124).

In an implementation, the third concentration of silicon (Si) in the first metal-containing film 114 may be, e.g., the same as the sixth concentration of silicon (Si) in the third metal-containing film 234.

By way of summation and review, a multigate transistor may facilitate easy scaling, and may use a three-dimensional channel. Further, current control capability may be enhanced without requiring increased gate length of the multigate transistor. Not only that, it is possible to effectively inhibit the short channel effect (SCE), which is an effect where the electric potential of a channel region is affected by a drain voltage.

The embodiments may provide a semiconductor device that provides various threshold voltages (Vt) by adjusting a concentration of a high-k dielectric material using a plurality of metal-containing films including silicon (Si) of different concentrations.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first active region and a second active region, which are arranged on the substrate;
a first recess on the first active region and intersecting with the first active region;
a second recess on the second active region and intersecting with the second active region;
a first gate spacer extending along sidewalls of the first recess and a second gate spacer extending along sidewalls of the second recess;
a first lower high-k dielectric film in the first recess, the first lower high-k dielectric film including a first high-k dielectric material in a first concentration and a second high-k dielectric material that is different from the first high-k dielectric material;
a second lower high-k dielectric film in the second recess, the second lower high-k dielectric film including the first high-k dielectric material in a second concentration that is greater than the first concentration, and the second high-k dielectric material;
a first metal-containing film on the first lower high-k dielectric film in the first recess, the first metal-containing film including silicon (Si) in a third concentration; and
a second metal-containing film on the second lower high-k dielectric film in the second recess, the second metal-containing film including silicon (Si) in a fourth concentration that is smaller than the third concentration.

2. The semiconductor device as claimed in claim 1, further comprising:
a first upper high-k dielectric film between the first lower high-k dielectric film and the first metal-containing film, the first upper high-k dielectric film including the first high-k dielectric material; and
a second upper high-k dielectric film between the second lower high-k dielectric film and the second metal-containing film, the second upper high-k dielectric film including the first high-k dielectric material.

3. The semiconductor device as claimed in claim 1, further comprising:
a first interface film between the first active region and the first lower high-k dielectric film; and
a second interface film between the second active region and the second lower high-k dielectric film.

4. The semiconductor device as claimed in claim 1, further comprising:
a third recess on a third active region arranged on the substrate and intersecting with the third active region;
a third lower high-k dielectric film in the third recess, the third lower high-k dielectric film including the second high-k dielectric material; and
a third metal-containing film on the third lower high-k dielectric film in the third recess, the third metal-containing film directly contacting the third lower high-k dielectric film.

5. The semiconductor device as claimed in claim 4, wherein the third metal-containing film includes silicon (Si) in a fifth concentration that is smaller than the third concentration.

6. The semiconductor device as claimed in claim 1, wherein:
the first metal-containing film includes the first high-k dielectric material in a seventh concentration, and
the second metal-containing film includes the first high-k dielectric material in an eighth concentration that is smaller than the seventh concentration.

7. The semiconductor device as claimed in claim 1, wherein the first high-k dielectric material includes scandium (Sc), yttrium (Y), or lanthanum (La).

8. The semiconductor device as claimed in claim 1, wherein the second high-k dielectric material includes hafnium (Hf), zirconium (Zr), titanium (Ti), tantalum (Ta), or aluminum (Al).

9. The semiconductor device as claimed in claim 1, wherein the fourth concentration is 0.

10. A semiconductor device, comprising:
a substrate;
a first active region and a second active region, the first active region and the second active region each extending along a first direction on the substrate;
a first gate structure on the first active region and extending along a second direction that intersects with the first direction, the first gate structure having a sequentially stacked structure of:
a first lower high-k dielectric film that includes a first high-k dielectric material in a first concentration and a second high-k dielectric material different from the first high-k dielectric material,
a first upper high-k dielectric film that includes the first high-k dielectric material, and
a first metal-containing film that includes silicon (Si) in a third concentration; and
a second gate structure on the second active region and extending along the second direction, the second gate structure having a sequentially stacked structure of:
a second lower high-k dielectric film that includes the first high-k dielectric material in a second concentration, which is greater than the first concentration, and the second high-k dielectric material, a second upper high-k dielectric film that includes the first high-k dielectric material, and a second metal-containing film that includes silicon (Si) in a fourth concentration that is smaller than the third concentration.

11. The semiconductor device as claimed in claim 10, wherein a first width of the first gate structure in the second direction is different from a second width of the second gate structure in the first direction.

12. The semiconductor device as claimed in claim 10, wherein a first height of the first gate structure in a third direction perpendicular to the first and second directions is different from a second height of the second gate structure in the third direction.

13. The semiconductor device as claimed in claim 10, wherein:

the first gate structure further includes a first interface film between the first active region and the first lower high-k dielectric film, and the second gate structure further includes a second interface film between the second active region and the second lower high-k dielectric film.

14. The semiconductor device as claimed in claim 10, further comprising:

a first capping pattern on the first gate structure; and a second capping pattern on the second gate structure.

15. A semiconductor device, comprising:

a substrate;

a first active region, a second active region, and a third active region on the substrate;

a first gate structure that intersects with the first active region, the first gate structure including:

a first lower high-k dielectric film that includes a first high-k dielectric material in a first concentration, and a second high-k dielectric material that is different from the first high-k dielectric material, and a first metal-containing film on the first lower high-k dielectric film, the first metal-containing film including silicon (Si) in a third concentration;

a second gate structure that intersects with the second active region, the second gate structure including:

a second lower high-k dielectric film that includes the first high-k dielectric material in a second concentration that is greater than the first concentration, and the second high-k dielectric material, and a second metal-containing film on the second lower high-k dielectric film, the second metal-containing film including silicon (Si) in a fourth concentration that is smaller than the third concentration; and a third gate structure that intersects with the third active region.

16. The semiconductor device as claimed in claim 15, further comprising:

a first upper high-k dielectric film between the first lower high-k dielectric film and the first metal-containing film, the first upper high-k dielectric film including the first high-k dielectric material; and a second upper high-k dielectric film between the second lower high-k dielectric film and the second metal-containing film, the second upper high-k dielectric film including the first high-k dielectric material.

17. The semiconductor device as claimed in claim 15, wherein the third gate structure includes:

a third lower high-k dielectric film including the second high-k dielectric material; and a third metal-containing film on the third lower high-k dielectric film, the third metal-containing film including silicon (Si) in a fifth concentration that is smaller than the third concentration.

18. The semiconductor device as claimed in claim 17, wherein the fourth concentration is the same as the fifth concentration.

19. The semiconductor device as claimed in claim 15, wherein the third gate structure includes:

a third lower high-k dielectric film that includes the second high-k dielectric material; and a fourth metal-containing film on the third lower high-k dielectric film, the fourth metal-containing film including silicon (Si) in a sixth concentration that is greater than the fourth concentration.

20. The semiconductor device as claimed in claim 19, wherein the third concentration is the same as the sixth concentration.

* * * * *